US009853359B2

(12) United States Patent
Elsherbini et al.

(10) Patent No.: US 9,853,359 B2
(45) Date of Patent: Dec. 26, 2017

(54) ANTENNA INTEGRATED IN A PACKAGE SUBSTRATE

(71) Applicants: Adel A. Elsherbini, Chandler, AZ (US); Telesphor Kamgaing, Chandler, AZ (US)

(72) Inventors: Adel A. Elsherbini, Chandler, AZ (US); Telesphor Kamgaing, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 224 days.

(21) Appl. No.: 14/038,202

(22) Filed: Sep. 26, 2013

(65) Prior Publication Data
US 2015/0084830 A1    Mar. 26, 2015

(51) Int. Cl.
*H01Q 21/00* (2006.01)
*H01Q 9/04* (2006.01)
*H01Q 21/06* (2006.01)

(52) U.S. Cl.
CPC ....... *H01Q 9/0414* (2013.01); *H01Q 21/0006* (2013.01); *H01Q 21/065* (2013.01); *H01Q 21/067* (2013.01); *H01L 2223/6677* (2013.01); *H01L 2224/16227* (2013.01); *H01L 2924/15321* (2013.01); *Y10T 29/49016* (2015.01)

(58) Field of Classification Search
CPC .. H01Q 9/045; H01Q 1/2283; H01Q 21/0006; H01Q 21/0043; H01Q 21/0075; H01Q 21/0081; H01Q 21/065; H01Q 9/0407–9/0478

USPC ................................................. 343/700 MS
See application file for complete search history.

(56) References Cited

U.S. PATENT DOCUMENTS

| 5,278,569 | A * | 1/1994 | Ohta et al. ............. 343/700 MS |
| 5,355,143 | A * | 10/1994 | Zurcher ............... H01Q 9/0457 343/700 MS |
| 5,497,164 | A * | 3/1996 | Croq .................... H01Q 19/005 343/700 MS |
| 5,898,403 | A * | 4/1999 | Saitoh .................... H01Q 1/243 333/185 |
| 6,133,882 | A * | 10/2000 | LaFleur ................... H01Q 1/38 343/700 MS |
| 6,856,300 | B2 * | 2/2005 | McCarrick .................... 343/853 |
| 7,209,083 | B2 * | 4/2007 | Fujishima et al. ..... 343/700 MS |
| 7,307,587 | B2 * | 12/2007 | Eom ........................ H01Q 1/22 343/700 MS |
| 7,525,489 | B2 * | 4/2009 | Ying ...................... H01Q 1/243 343/702 |
| 7,636,063 | B2 * | 12/2009 | Channabasappa ... H01Q 9/0407 343/700 MS |
| 2010/0073238 | A1 * | 3/2010 | Jun et al. ............... 343/700 MS |

* cited by examiner

*Primary Examiner* — Tho G Phan
*Assistant Examiner* — Patrick Holecek
(74) *Attorney, Agent, or Firm* — Schiff Hardin LLP

(57) ABSTRACT

An antenna integrated in a package substrate, the antenna comprising an upper antenna element, a lower antenna element and a coupling element disposed between the upper antenna element and the lower antenna element, the coupling element comprising an aperture, and configured to provide a coupling between the upper antenna element and the lower antenna element.

19 Claims, 5 Drawing Sheets

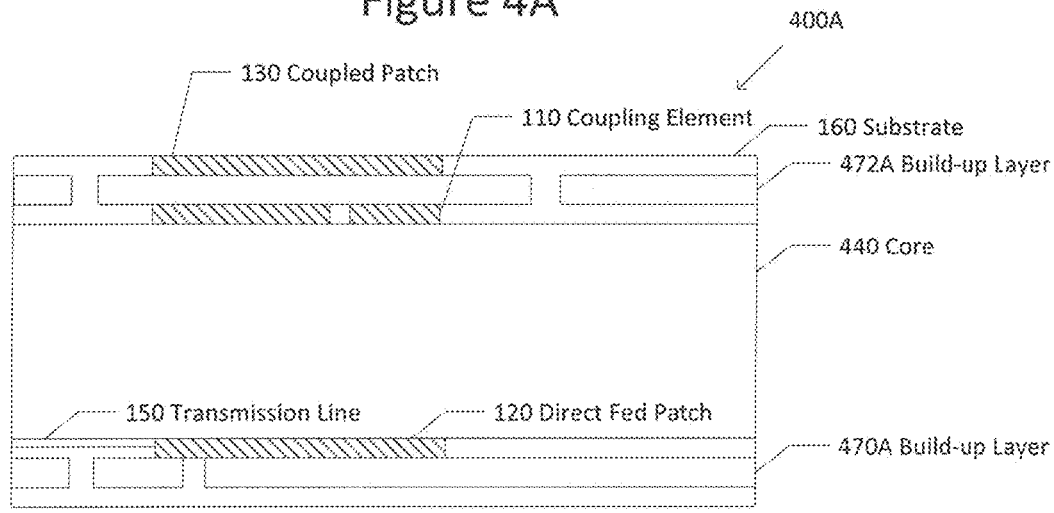
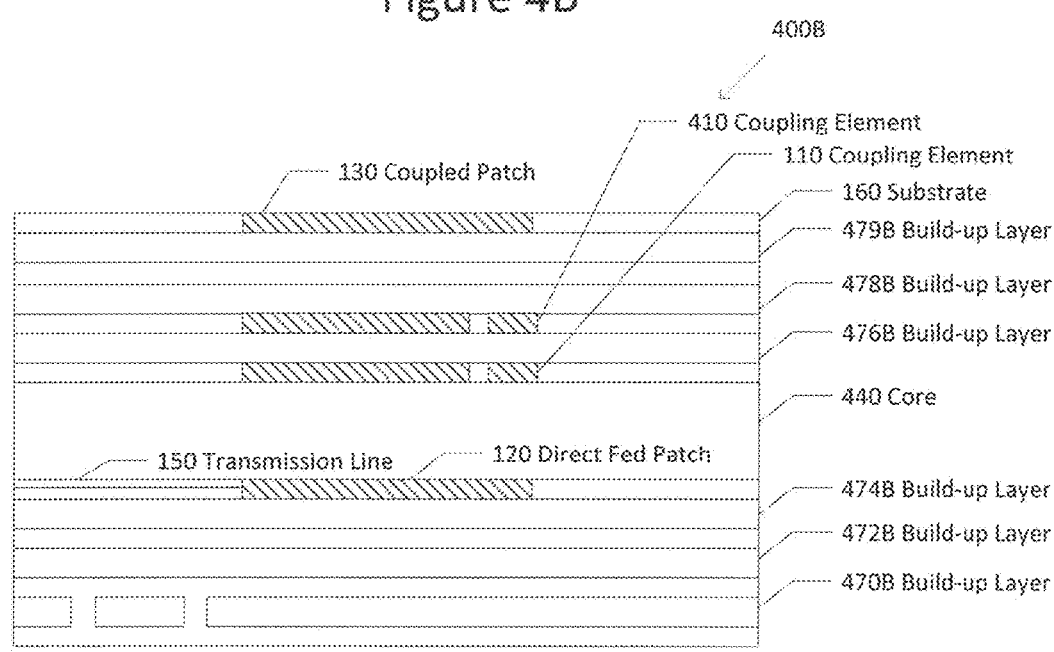

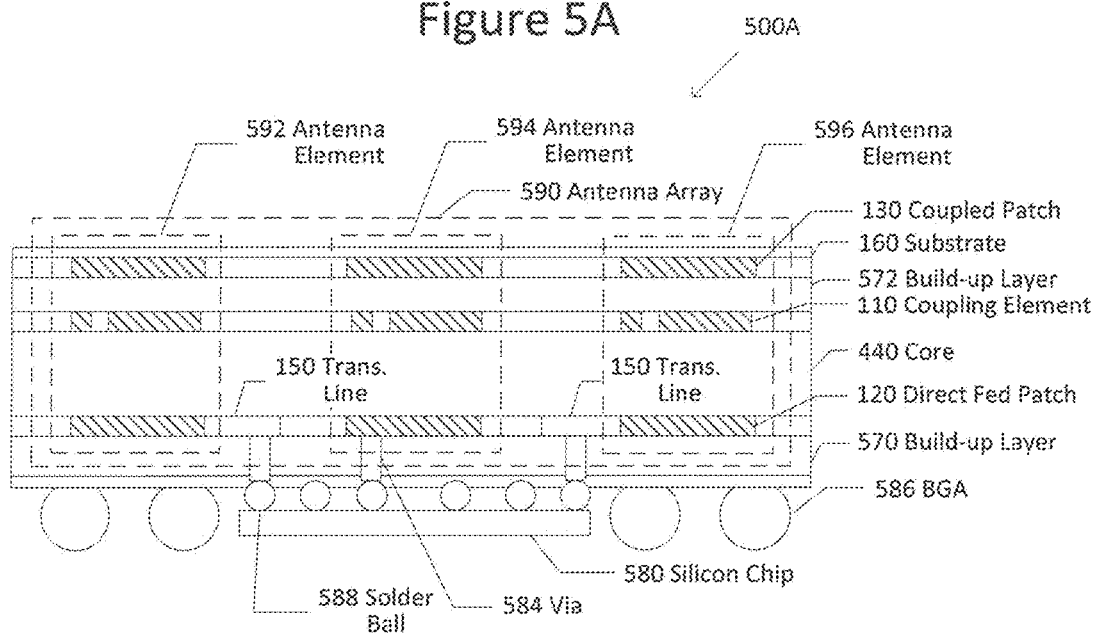
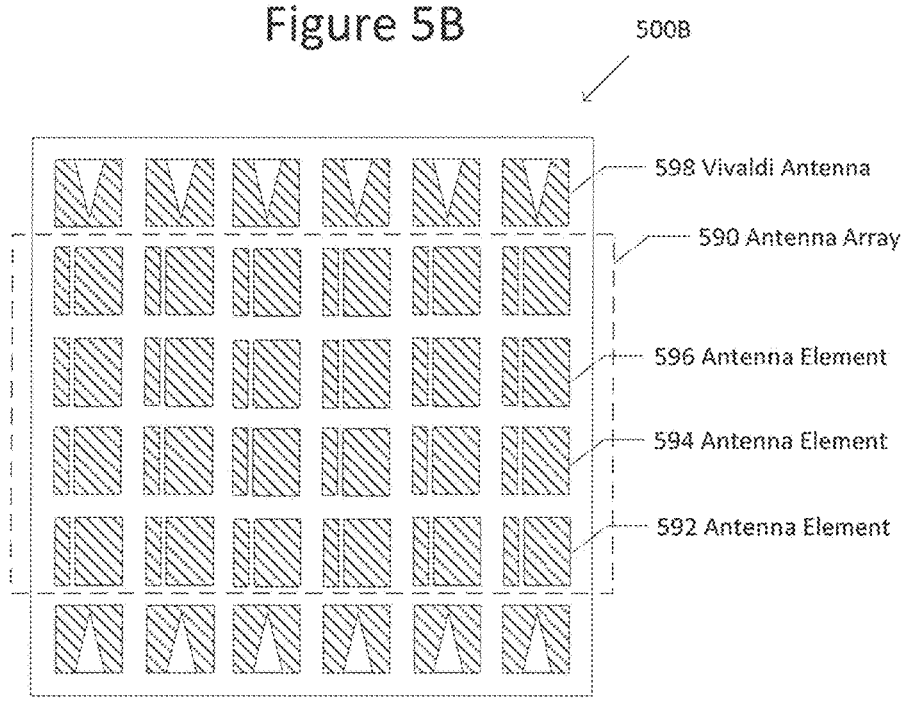

ANTENNA INTEGRATED IN A PACKAGE SUBSTRATE

TECHNICAL FIELD

Embodiments described herein generally relate to an antenna, and in particular an antenna integrated in a package substrate, a wireless handheld device comprising such an antenna, and a method of manufacturing such an antenna.

BACKGROUND

Higher frequency applications operate in the millimeter-wave frequency range of 30 GHz to 300 GHz, and may provide wireless communications at unidirectional data rates exceeding 2.0 Gigabytes per link. Examples of these applications include Wireless Display (WiDi), wireless docking, wireless probes for post-silicon validation, and wireless chip-to-chip communications within and between platforms.

For these applications, several antenna structures small enough to fit within a package substrate of a wireless die have been proposed. In order to achieve a desired bandwidth, many of these antenna structures require several package build-up layers formed using expensive fabrication technology, such as low temperature co-fired ceramic (LTCC), or must be placed inside an air cavity within the package, leading to fabrication and reliability problems. Standard packages require thin build-up layers to enable thin vias (via aspect ratio should be close to one) and dense interconnects. However, this requirement conflicts with a requirement for thick, almost evenly spaced layers needed to obtain wide-band, high-efficiency, multi-layer antenna designs, such as stacked patch antennas. One solution to overcome these conflicting requirements is to implement several thin layers to enable small vias and at the same time obtain an overall thickness large enough for wide-band antenna designs. This solution, however, leads to an increase in package cost and reduction in yield. Also, the resulting ultra-thick packages conflict with a goal for achieving ultra-thin portable devices, such as tablets, smartphones and wearable computing devices.

BRIEF DESCRIPTION OF THE DRAWINGS

FIGS. 4A and 4B illustrates cross-sectional schematic diagram of antennas in accordance with exemplary embodiments.

FIG. 5A illustrates a cross-sectional schematic diagram of a package including a phased array of antenna elements in accordance with an exemplary embodiment.

FIG. 5B illustrates a top view of a mixed array of antenna elements in accordance with an exemplary embodiment.

DESCRIPTION OF THE EMBODIMENTS

The present disclosure is directed to an antenna integrated in a package substrate, the antenna comprising an upper antenna element, a lower antenna element, and a coupling element disposed between the upper antenna element and the lower antenna element. The coupling element comprises an aperture and is configured to provide a coupling between the upper antenna element and the lower antenna element.

Figure 1A:
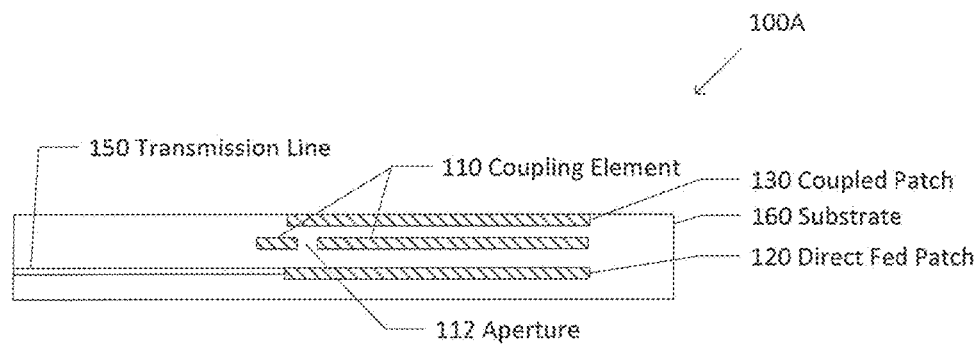
FIGS. 1A and 1B illustrate a schematic diagram of an antenna in accordance with an exemplary embodiment.
Figure 1B:
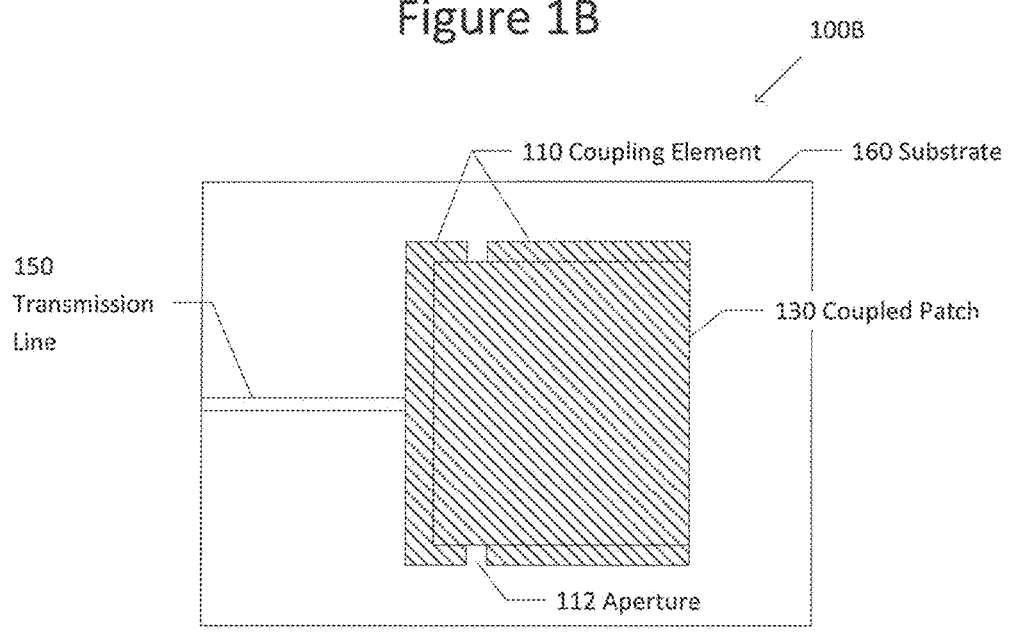

FIGS. 1A and 1B illustrate a schematic diagram of an antenna in accordance with an exemplary embodiment. FIG. 1A illustrates a cross-sectional view of antenna 100A, and FIG. 1B illustrates a top view of antenna 100B.

A standard two-layer stacked patch antenna operates based on a coupling between two patches, a direct fed patch and a coupled patch. These patches generate two resonances that can be brought close together in frequency to achieve wideband operation compared to a single layer patch antenna. This stacked patch antenna is generally disposed on a multilayer organic or inorganic package substrate. At millimeter wave frequencies, the substrate material may be a low loss material such as low temperature co-fired ceramic (LTCC) or liquid crystal polymer (LCP) substrate and may have, for example, a 50-100-50 um build-up. These build-up dimensions apply for the LCP designed for operation at 57-66 GHz. It will be appreciated that in the same frequency range, the layer thicknesses for LTCC would be greater because LTCC has higher dielectric constant.

Antenna 100 (where 100 represents each of 100A and 100B) in accordance with an exemplary embodiment shown in FIGS. 1A and 1B includes within build-up layers of package substrate 160 a stacked patch antenna. To improve the performance of the standard stacked patch antenna and meet the requirements for high frequency applications without increasing package height, a coupling element 110 with an aperture 112 is disposed between direct fed patch 120 (lower antenna element) and coupled patch 130 (upper antenna element). This coupling element 110 significantly improves the coupling between coupled patch 130 and direct fed patch 120. Direct fed patch 120 couples with coupling element 110, and coupling element 110 in turn couples with coupled patch 130, as will be described in more detail below. The stacked patch antenna 100 operates over a wider bandwidth compared to the standard stacked patch antenna, while maintaining thin build-up layers, avoiding any significant increase in package height, and enabling integration of antenna and chips with high-density interconnects on the same package.

Figure 2A:
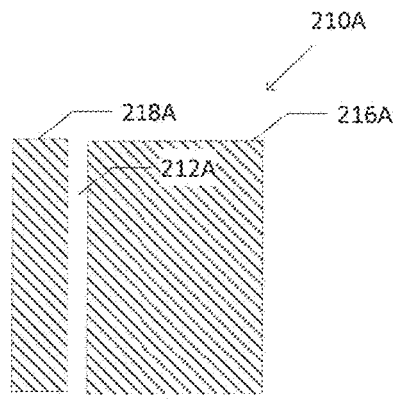
FIGS. 2A-2C illustrate top views of coupling elements in accordance with exemplary embodiments.
Figure 2B:
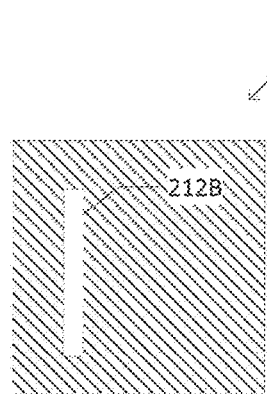
Figure 2C:
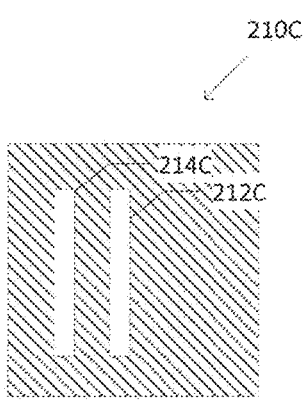

FIGS. 2A-2C illustrate top views of coupling elements 210 in accordance with exemplary embodiments. Each of coupling elements 210 shown corresponds with coupling element 110 of FIGS. 1A and 1B.

FIG. 2A illustrates coupling element 210A in accordance with an exemplary embodiment. Coupling element 210A has a generally rectangular shape and an aperture that is an open slot 212A that splits coupling element 210A into two separate components 216A, 218A.

In operation, direct fed patch 120 (lower antenna element) is excited by transmission line 150 shown in FIGS. 1A and 1B. A generated current in direct fed patch 120 causes a coupling between direct fed patch 120 and coupling element 210A; more specifically, the current in direct fed patch 120 generates a field distribution across the coupling element's aperture 212A, thereby causing a corresponding current in coupling element 210A. This current in coupling element 210A similarly causes a coupling between coupling element 210A and coupled patch 130 (upper antenna element); more specifically, this current in coupling element 210A generates a field that causes a current in coupled patch 130. The result is a coupling between direct fed patch 120 and coupled patch 130 being improved by an intermediate coupling by coupling element 210A. Without coupling element 210A, direct fed patch 120 would not generate a sufficient field to permit an adequate coupling and sufficient bandwidth for higher frequency applications as described above.

An aperture 212A in coupling element 210A is necessary so as to not isolate direct fed patch 120 from coupled patch 130. The length of aperture 212A is defined by its operating frequency. When the length of aperture 212A is about one-half of a wavelength ($\lambda/2$) or a fraction or a rational multiple of the free space wavelength of the radio waves, there is resonance and thus maximum energy transfer. At this length, aperture 212A acts as a capacitance and inductance in parallel, radiates a field, and thereby improves a coupling between the direct fed patch 120 and coupled patch 130. Such a parallel LC resonator has broader bandwidth. It is appreciated that the length of aperture 212A would be exactly $\lambda/2$ only in free space. In reality, direct fed patch 120 and coupled patch 130 add a parasitic capacitance, due to surrounding dielectric material, and also add a parasitic coupling between direct fed patch 120 and coupled patch 130, so resonance does not occur at exactly one-half of a free space wavelength.

Dimensions of direct fed patch 120, coupled patch 130, and coupling element 10A should be such that these elements resonate close to each other in frequency to result wider bandwidth. For example, if direct fed patch 120 has a resonant frequency of approximately 57-58 GHz, to have a sufficient coupling, coupled patch 130 should have a resonant frequency of approximately 63-64 GHz. On the other hand, if direct fed patch 120 and coupled patch 130 do not resonate close, to each other in frequency, direct fed patch 120 would resonate at its resonant frequency, coupled patch 130 would resonate at its on resonant frequency, and between these two individual resonant frequencies, the stacked patch antenna would have a high reflection coefficient and not operate in the frequency band of interest.

FIG. 2B illustrates coupling element 210B in accordance with another exemplary embodiment. Coupling element 210B, like coupling element 210A, has a generally rectangular shape. However, coupling element 210B is different in that its aperture 212B is a closed slot such that coupling element 210B is a single component 210B, in operation in the desired frequency range, coupling element 210B functions basically the same as coupling element 210A as described above. Of course it is appreciated that the basic functions of coupling elements 210A and 210B including transferring maximum energy at the resonance frequency is the same, but how coupling elements 210A and 210B function outside of this resonance frequency may be slightly different.

FIG. 2C illustrates coupling element 210C in accordance with another exemplary embodiment. Coupling element 21C, like coupling element 210B, has generally rectangular shape and is a single component. However, the aperture of coupling element 210C is comprised of two closed slots 212C, 214C. The two closed slots 212C, 214C in this example are disposed in parallel to one another, though this is not necessarily required. In operation, coupling element 210C functions basically the same as coupling element 210A as described above.

While each of coupling elements 210A, 210B, and 210C has a substantially rectangular shape, the disclosure is not limited in this respect. Coupling element 210 may be substantially square, circular or any other shape suitable for its intended purpose. Also, while each of apertures 212A, 2128, 212C, 214C is shown comprising a substantially rectangular shape, the disclosure is not limited in this respect. The aperture(s) may comprise any shape suitable for its intended purpose. For example, the aperture(s) may comprise a shape that is curved or substantially circular. Also, the aperture(s) may meander around so as to obtain length while at the same time avoiding traversing particular areas of the package. It is appreciated that the specific coupling element best suited for a particular application depends on the desired bandwidth, desired operating frequency and the build-up structure. Note that FIGS. 2A-2C, like the other figures throughout this disclosure, are not necessarily drawn to scale.

Figure 3:
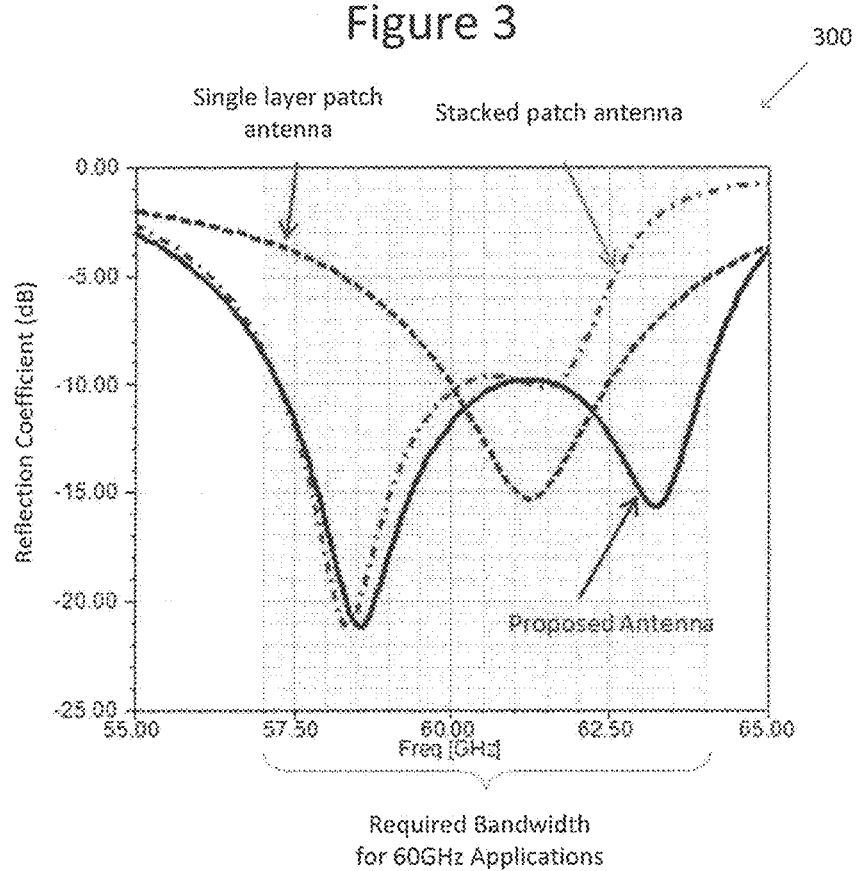
FIG. 3 is a graph illustrating performance of three antennas.

FIG. 3 is a graph 300 illustrating relative bandwidth performance of three antennas—a standard single layer patch antenna, a standard stacked patch antenna, and an antenna comprising coupling element 210A in accordance with the exemplar embodiment shown in FIG. 2A. Relative bandwidth is defined as the frequency range at which the reflection coefficient of the antenna is less than −10 dB. As can be seen, the standard single layer patch antenna has 3% relative bandwidth. The standard stacked patch antenna generates two resonances brought close together in frequency to achieve wideband operation as compared to the standard single layer patch antenna, in this case 7% relative bandwidth. Even though there is significant improvement in bandwidth compared with the single layer patch antenna, the relative bandwidth is still not sufficient for high frequency applications, such as 60 GHz applications which require operation over at least 57-64 GHz, that is, approximately 12% relative bandwidth. The antenna comprising, coupling element 210A in accordance with the exemplary embodiment, on the other hand, has a sufficient coupling over the desired bandwidth while maintaining package height (e.g., 300 um). It should be appreciated that the bandwidth shown is mostly for the United States. Japan, for example, requires bandwidth up to 66 GHz. While FIG. 3 illustrates an antenna design for the United States, the same design could be optimized for broader bandwidth using a different coupling element, for example.

FIGS. 4A and 4B illustrate cross-sectional schematic diagrams of antennas 400 in accordance with exemplary embodiments.

FIG. 4A illustrates placement of a stacked patch antenna in build-up layers of substrate 160 in accordance with an exemplary embodiment. Antenna 400A is similar to antenna 100A, except that antenna 400A additionally shows placement of the antenna relative to the build-up layers 470A, 472A and core 440. Better coupling is achieved when coupling element 110 is disposed in a layer as close to a midpoint between coupled patch 130 and direct fed patch 120 as possible. Also, coupled patch 130 and coupling element 110 should be disposed above core 440, and direct fed patch 120 disposed below core 440.

FIG. 4B illustrates placement of a stacked patch antenna of an antenna 400B in accordance with another exemplary embodiment. Antenna 400B differs from antenna 480A in that rather than a single coupling element 110, there are multiple coupling elements, in this example two, with the addition of coupling element 410. Of course there may be more than two coupling elements. There are also additional build-up layers 470B, 472B, 474B, 476B, 478B, 479B. As is known, for each additional build-up layer on one side of core 440, there should, be a corresponding build-up layer on the other side.

Each coupling element 110, 410 has at least one aperture configured to provide a coupling between coupled patch 130 and direct fed patch 120. The apertures should be aligned so that they act as a vertical waveguide to allow the fields to pass through the apertures from direct fed patch 120 to coupled patch 130. It is possible to adjust positions of apertures to some degree in order to obtain a wider bandwidth. Sizes of apertures need to be similar to each other, but it is possible to have one aperture be wider than another aperture so that there is coupling at different frequencies and staggering of the bandwidth. There is no required order of the placement and different widths of the apertures provided that each of the coupling elements contributes to providing a coupling between direct fed patch 120 and coupled patch 130. Those of skill will appreciate, based on the description above with respect to FIG. 2A, how the multiple coupling elements operate together to contribute to better coupling between direct fed patch 120 and coupled patch 130. For the sake of brevity, therefore, a more detailed description is not provided here.

While FIGS. 1A, 1B, 4A, and 4B show a coupling element 110 generally, it is understood that this is merely for convenience. Coupling element 110 may be any coupling element shown and/or described in accordance with the exemplary embodiments.

FIG. 5A illustrates a cross-sectional schematic diagram 500A of package including a phased array of antenna elements 592, 594, 596 in accordance with an exemplary embodiment.

A phased array antenna, as is known, is composed of antenna elements 592, 594, 596 each with a phase shifter not shown). Beams are formed by shifting the phase of the signal emitted from each antenna element 592, 594, 596 to provide constructive destructive interference so as to steer the radiated beams in a desired direction.

Antenna elements 592 and 596 are shown fed using a transmission line 150, and antenna element 594 is shown fed directly from a via 584. These feeding techniques are merely implementation example; the disclosure is not limited in these respects. Package substrate 160 is mounted to a silicon chip 580 using solder balls 588 and mounted onto a device, such as a microprocessor, using a ball grid array (BGA) 586. These mounting techniques are merely implementation example; the disclosure is not limited in these respects.

FIG. 5B illustrates a top view of an array 500B of antenna elements in accordance with an exemplary embodiment.

Phased array antenna 590 comprise, a 4×6 array of antenna elements 592, 594, 596, etc. Each of these antenna elements corresponds to any antenna integrated in build-up layers of a package substrate in accordance with any of the exemplary embodiments described herein. Antenna array 590 is a non-uniform array, meaning some of the antenna elements are not identical to other antenna elements. The antenna elements are separated by a wavelength of approximately one-half of a wavelength ($\lambda/2$) or a fraction or a rational multiple of the free space wavelength of the radio waves.

Also included on the same substrate is a Vivaldi antenna, which is known, so a detailed explanation will not be included here. The Vivaldi antenna was chosen because it radiates in a different direction from antenna elements 592, 594, 596, etc. of antenna array 590, thereby resulting in antenna array 590 having a broad scanning angle. It is appreciated that the Vivaldi antenna is merely an implementation example, and the disclosure is not limited in this respect.

Figure 6:
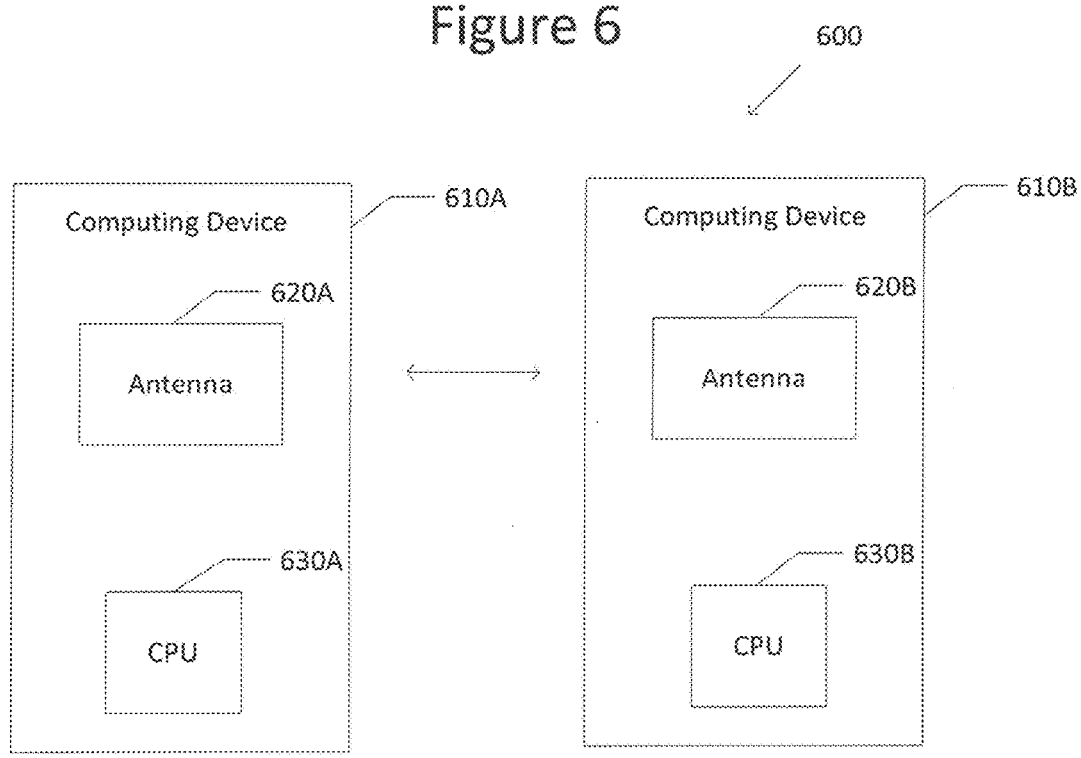
FIG. 6 is a schematic diagram illustrating a system comprising two computing devices, each comprising an antenna in accordance with an exemplary embodiment.

FIG. 6 is a schematic diagram illustrating a system 600 comprising two computing devices 610A, 610B, each comprising an antenna 620A, 620B in accordance with at least one of the exemplary embodiments and CPU 630A, 630B. Those of skill in the art appreciate that many components are not shown so as to not unnecessarily obscure aspects of the disclosure. With antenna 620A, 620B, computing devices 610A, 610B are capable of communicating data wirelessly at high frequencies while maintaining a thin profile. Each of computing devices 610A, 610B may be any computing device, such as a PC or laptop, any wireless handheld device, such as a tablet or smartphone, mobile device or any other suitable computing device. Alternatively, the computing devices 610A, 610B may be any of a module suitable for use in a wireless link of a data center, a cell of a cellular communication network, a docking station, among others.

Figure 7:
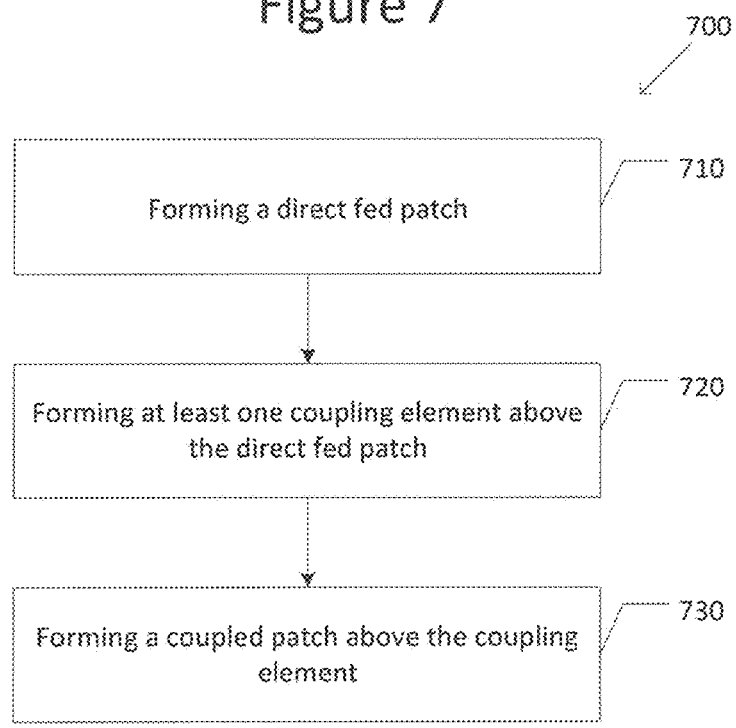
FIG. 7 is a flowchart illustrating a method of manufacturing an antenna in accordance with an exemplary embodiment.

FIG. 7 is a flowchart illustrating a method of manufacturing an antenna in accordance with an exemplary embodiment.

A direct fed patch 120 is formed at Step 710. At least one coupling element 110 is formed, at Step 720, to be disposed above direct fed patch 120. Coupling element 110 has one or more apertures, as described above. Coupled patch 130 is formed, at Step 730, to be disposed above coupling element 110. As discussed above, the aperture(s) of coupling element 110 are configured to provide a coupling between direct fed patch 120 and coupled patch 130. It is appreciated by those of skill that intermediate steps of the method have been omitted so as to not unnecessarily obscure aspects of the disclosure. Also, the steps of this method are not required to be carried out in any specific order.

The stacked patch antennas described in this disclosure may be on a standard 50-100-50 um four-layer antenna, for example. With the metal layers and the solder resist layers, the overall thickness of such an antenna is less than 300 um for applications around 60 GHz, which allows the antenna to fit in much thinner devices as compared with conventional 600-1000 um thick standard antennas. The 50 um build-up layers allows dense interconnects due to smaller vias and transmission line dimensions. Furthermore the thickness of the package further decreases for implementation at higher millimeter-wave frequencies without substantial loss in antenna's fractional bandwidth.

The embodiments have been described using a stacked patch antenna, the disclosure is not limited in this respect. The antenna may be any antenna with stackable components suitable for the intended purpose. Also, the antennas may be alternatively implemented on a coreless substrate, and/or a ground plane may be present on the lowest metal layer.

Advantages of one or more of the exemplary embodiments described herein include an antenna that operates over a wider bandwidth, maintains thin build-up layers and thus dense interconnects, and avoids a significant increase in height.

The following examples pertain to further embodiments.

Example 1 is an antenna integrated in a package substrate, the antenna comprising an upper antenna element, a lower antenna element, and a coupling element disposed between the upper antenna element and the lower antenna element, the coupling element comprising an aperture, and configured to provide a coupling between the upper antenna element and the lower antenna element.

In Example 2, the subject matter of Example 1 can optionally include that the coupling element is disposed in a layer closest to a midpoint between the upper antenna element and the lower antenna element.

In Example 3, the subject matter of Example 1 can optionally include a core, wherein the upper antenna element and the coupling element are disposed above the core, and the lower antenna element is disposed below the core.

In Example 4, the subject matter of Example 1 can optionally include that the coupling element comprises a rectangular shape.

In Example 5, the subject matter of Example 1 can optionally include that the aperture is a slot.

In Example 6, the subject matter of Example 5 an optionally include that the slot is an open slot that splits the coupling element into separate components.

In Example 7, the subject matter of Example 5 can optionally include that the slot is a closed slot.

In Example 8, the subject matter of Example 5 can optionally include that the aperture is comprised of a plurality of closed slots.

In Example 9, the subject matter of Example 8 can optionally include that the plurality of closed slots are disposed in parallel to one another.

In Example 10, the subject matter of Example 5 can optionally include that slot comprises a shape that is substantially rectangular.

In Example 11, the subject matter of Example 1 can optionally include that the aperture comprises a length that is equal to about one-half a wavelength.

In Example 12, the subject matter of Example 1 can optionally include that the aperture comprises a length that is a fractional or a rational multiple of a free space wavelength.

In Example 13, the subject matter of Example 1 can optionally include that the aperture comprises a curved shape.

In Example 14, the subject matter of Example 1 can optionally include that the aperture comprises a shape that is substantially circular.

In Example 15, the subject matter of Example 1 can optionally include a plurality of coupling elements disposed between the upper antenna element and the lower antenna element, wherein each of the plurality of coupling elements comprises at least one aperture and is configured to provide a coupling between the upper antenna element and the lower antenna element.

In Example 16, the subject matter of Example 15 can optionally include that at least two of the respective apertures comprise different widths.

In Example 17, the subject matter of Example 1 can optionally include that the antenna is a patch antenna, that the upper antenna element is a coupled patch, and that the lower antenna element is a direct fed patch.

Example 18 is a computing device comprising the antenna of Example 1.

Example 19 is a wireless handheld device comprising the antenna of Example 1.

Example 20 is a mobile device comprising the antenna of Example 1.

Example 21 is phased array of antennas, wherein each antenna is the antenna of Example 1.

Example 22 is an antenna, comprising an upper antenna element, a lower antenna element, and a coupling means for providing coupling between the upper antenna element and the lower antenna element, wherein the coupling means comprises an aperture and is disposed between the upper antenna element and the lower antenna element.

In Example 23, the subject matter of Example 22 can optionally include that the aperture is a slot.

Example 24 is a method of manufacturing an antenna integrated in a package substrate, the method comprising forming a lower antenna element, forming at least one coupling element disposed above the antenna element, and forming an upper antenna element disposed above the coupling element, wherein at least one coupling element comprises an aperture and is configured to provide a coupling between the upper antenna element and the lower antenna element.

In Example 25, the subject matter of Example 24 can optionally include that the aperture is a slot.

While the foregoing has been described in conjunction with exemplary embodiment, it is understood that the term "exemplary" is merely meant as an example, rather than the best or optimal. Accordingly, the disclosure is intended, to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific exemplary embodiments shown and described without departing from the scope of the disclosure. This disclosure is intended to cover any adaptations or variations of the specific exemplary embodiments discussed herein.

The invention claimed is:

1. An antenna integrated in a package substrate, the antenna comprising:
    a single upper antenna element, which is contiguous;
    a lower antenna element; and
    an ungrounded coupling element disposed between the upper antenna element and the lower antenna element, the ungrounded coupling element comprising an open slot aperture that splits the ungrounded coupling element into separate components, and configured to provide a coupling between the upper antenna element and the lower antenna element,
    wherein outer edges of the ungrounded coupling element are galvanically free from contact with outer edges of the package substrate.

2. The antenna of claim 1, wherein the ungrounded coupling element is disposed in a layer closest to a midpoint between the upper antenna element and the lower antenna element.

3. The antenna of claim 1, further comprising a core, wherein the upper antenna element and the ungrounded coupling element are disposed above the core, and the lower antenna element is disposed below the core.

4. The antenna of claim 1, wherein the ungrounded coupling element comprises a rectangular shape.

5. The antenna of claim 1, wherein the slot comprises a shape that is substantially rectangular.

6. The antenna of claim 1, wherein the aperture comprises a length that is equal to about one-half of a wavelength.

7. The antenna of claim 1, wherein the aperture comprises a length that is a fractional or a rational multiple of a free space wavelength.

8. The antenna of claim 1, wherein the aperture comprises a curved shape.

9. The antenna of claim 1, wherein the aperture comprises a shape that is substantially circular.

10. The antenna of claim 1, wherein the antenna is a patch antenna, wherein the upper antenna element is a coupled patch, and wherein the lower antenna element is a direct fed patch.

11. A computing device comprising the antenna of claim 1.

12. A wireless handheld device comprising the antenna of claim 1.

13. A mobile device comprising the antenna of claim 1.

14. A phased array of antennas, wherein each antenna is the antenna of claim 1.

15. An antenna integrated in a package substrate, the antenna comprising:
- a single upper antenna element, which is contiguous;
- a lower antenna element;
- an ungrounded coupling element disposed between the upper antenna element and the lower antenna element, the ungrounded coupling element comprising an aperture, and configured to provide a coupling between the upper antenna element and the lower antenna element, wherein outer edges of the ungrounded coupling element are galvanically free from contact with outer edges of the package substrate; and
- a plurality of ungrounded coupling elements disposed between the upper antenna element and the lower antenna element, wherein each of the plurality of ungrounded coupling elements comprises at least one aperture and is configured to provide a coupling between the upper antenna element and the lower antenna element, wherein at least two of the respective apertures comprises different widths.

16. An antenna integrated in a package substrate, comprising:
- a single upper antenna element, which is contiguous;
- a lower antenna element; and
- an ungrounded coupling means for providing coupling between the upper antenna element and the lower antenna element, wherein the ungrounded coupling means comprises an open slot aperture that splits the ungrounded coupling element into separate components, and is disposed between the upper antenna element and the lower antenna element,
wherein outer edges of the ungrounded coupling means are galvanically free from contact with outer edges of the package substrate.

17. The antenna of claim 16, wherein the aperture is a slot.

18. A method of manufacturing an antenna integrated in a package substrate, the method comprising:
- forming a lower antenna element;
- forming at least one ungrounded coupling element disposed above the lower antenna element; and
- forming a single upper antenna element, which is contiguous and disposed above the ungrounded coupling element,
wherein the at least one ungrounded coupling element comprises an open slot aperture that splits the ungrounded coupling element into separate components, and is configured to provide a coupling between the upper antenna element and the lower antenna element, and outer edges of the at least one ungrounded coupling element are galvanically free from contact with outer edges of the package substrate.

19. A method of manufacturing a phased array of antennas integrated in a package substrate, the method comprising:
- forming the phased array of antennas by manufacturing each of the antennas of the phased array according to the method of claim 18.

* * * * *